US008878260B2

(12) United States Patent
Anderson et al.

(10) Patent No.: US 8,878,260 B2
(45) Date of Patent: Nov. 4, 2014

(54) DEVICES WITH GATE-TO-GATE ISOLATION STRUCTURES AND METHODS OF MANUFACTURE

(75) Inventors: Brent A. Anderson, Jericho, VT (US); Edward J. Nowak, Essex Junction, VT (US); Jed H. Rankin, Richmond, VT (US)

(73) Assignee: International Business Machines Corporation, Armonk, NY (US)

( * ) Notice: Subject to any disclaimer, the term of this patent is extended or adjusted under 35 U.S.C. 154(b) by 166 days.

(21) Appl. No.: 13/589,606

(22) Filed: Aug. 20, 2012

(65) Prior Publication Data

US 2012/0306016 A1 Dec. 6, 2012

Related U.S. Application Data

(62) Division of application No. 12/902,793, filed on Oct. 12, 2010, now Pat. No. 8,298,913.

(51) Int. Cl.
| | |
|---|---|
| *H01L 29/76* | (2006.01) |
| *H01L 21/8234* | (2006.01) |
| *H01L 21/84* | (2006.01) |
| *H01L 21/762* | (2006.01) |
| *H01L 27/12* | (2006.01) |
| *H01L 21/28* | (2006.01) |

(52) U.S. Cl.
CPC .. *H01L 21/28123* (2013.01); *H01L 21/823481* (2013.01); *H01L 21/845* (2013.01); *H01L 21/76283* (2013.01); *H01L 21/823456* (2013.01); *H01L 27/1211* (2013.01); *H01L 21/823431* (2013.01); *H01L 21/823437* (2013.01)
USPC .......................................... 257/288; 438/430

(58) Field of Classification Search
USPC .................. 438/157, 197, 430, 587; 257/288, 257/E21.7, E21.616, E27.099
See application file for complete search history.

(56) References Cited

U.S. PATENT DOCUMENTS

| | | | |
|---|---|---|---|
| 6,022,781 | A | 2/2000 | Noble, Jr. et al. |
| 6,110,787 | A | 8/2000 | Chan et al. |
| 6,787,402 | B1 | 9/2004 | Yu |
| 6,924,178 | B2 | 8/2005 | Beintner |
| 7,453,123 | B2 | 11/2008 | Dokumaci et al. |

(Continued)

OTHER PUBLICATIONS

Notice of Allowance for related U.S. Appl. No. 12/902,776 dated Nov. 14, 2012.

(Continued)

*Primary Examiner* — Shaun Campbell
(74) *Attorney, Agent, or Firm* — Michael LeStrange; Roberts Mlotkowski Safran & Cole, P.C.

(57) ABSTRACT

A method includes forming a plurality of trenches in a pad film to form raised portions, and depositing a hard mask in the trenches and over the upper pad film. The method includes forming a plurality of fins including the raised portions and a second plurality of fins including the hard mask deposited in the trenches, each of which are separated by a deep trench. The method includes removing the hard mask on the plurality of fins including the raised portions and the second plurality of fins resulting in a dual height fin array. The method includes forming gate electrodes within each deep trench between each fin of the dual height fin array, burying the second plurality of fins and abutting sides of the plurality of fins including the raised portions. The plurality of fins including the raised portions electrically and physically isolate adjacent gate electrode of the gate electrodes.

20 Claims, 11 Drawing Sheets

(56) References Cited

U.S. PATENT DOCUMENTS

| | | |
|---|---|---|
| 7,537,985 B2 | 5/2009 | Anderson et al. |
| 7,557,401 B2 | 7/2009 | Yonehama et al. |
| 7,666,732 B2 | 2/2010 | Doris et al. |
| 2007/0026617 A1* | 2/2007 | Adkisson et al. ............ 438/300 |
| 2008/0050866 A1 | 2/2008 | Booth |
| 2009/0045449 A1 | 2/2009 | Aritome |
| 2009/0309136 A1 | 12/2009 | Chen et al. |
| 2010/0093167 A1 | 4/2010 | Lee et al. |
| 2010/0118599 A1* | 5/2010 | Marshall et al. ............ 365/154 |
| 2010/0248454 A1 | 9/2010 | Maszara et al. |

OTHER PUBLICATIONS

Final Office action for related U.S. Appl. No. 12/902,803 dated Nov. 9, 2012.

Notice of Allowance for related U.S. Appl. No. 12/902,803 dated Jan. 28, 2013.

\* cited by examiner

DEVICES WITH GATE-TO-GATE ISOLATION STRUCTURES AND METHODS OF MANUFACTURE

CROSS REFERENCE TO RELATED APPLICATIONS

The present application is a divisional application of copending application Ser. No. 12/902,793, filed on Oct. 12, 2010, the contents of which are incorporated by reference herein in its entirety.

FIELD OF THE INVENTION

The invention relates to semiconductor structures and methods of manufacture and, more particularly, to devices having gate-to-gate isolation structures and methods of manufacture.

BACKGROUND

Photolithography (or "optical lithography") is a complex process used in semiconductor processing to selectively remove parts of a thin film or the bulk of a substrate to build structures. This process uses light to transfer a geometric pattern from a photo mask to a light-sensitive chemical, e.g., photoresist or "resist," on the substrate. A series of chemical treatments, e.g., etching processes, then engraves the exposure pattern into the material underneath the photoresist. In complex integrated circuits, for example a modern CMOS, a wafer may go through the photolithographic cycle up to 50 times. The patterning can be used to form gates, as well as isolation structures, wiring layers, contacts, etc.

As the imaging becomes ever so smaller in newer technologies, the photolithographic process must transfer smaller and smaller images (patterns) onto the photo mask. However, as conventional resolution limits of lithography continue to be exceeded, in particular at the 15 nm node, and beyond, new technology integration schemes may be needed to ease the burden on patterning. For example, in newer technologies it is becoming difficult to isolate transistors (gates) with critical spacing, while maintaining the minimum image of the gate electrodes, themselves. To ensure minimum image of the gate electrodes and that gates remain isolated (e.g., do not short circuit), large isolation regions are formed between gates. This can be accomplished with photolithographic process since such large isolation regions do not exceed conventional resolution limits of lithography. Although these large isolation regions allow the designer and engineer to maintain the minimum image of the gates, such isolation regions take up valuable chip real estate. This, in turn, limits the density of the chip.

Accordingly, there exists a need in the art to overcome the deficiencies and limitations described hereinabove.

SUMMARY

In a first aspect of the invention, a method comprises forming a plurality of trenches in a pad film to form raised portions. The method further comprises depositing a hard mask in the trenches and over the upper pad film. The method further comprises forming a plurality of fins comprising the raised portions and a second plurality of fins comprising the hard mask deposited in the trenches, each of which are separated by a deep trench. The method further comprises removing the hard mask on the plurality of fins comprising the raised portions and the second plurality of fins resulting in a dual height fin array. The method further comprises forming gate electrodes within each deep trench between each fin of the dual height fin array, burying the second plurality of fins and abutting sides of the plurality of fins comprising the raised portions. The plurality of fins comprising the raised portions electrically and physically isolate adjacent gate electrode of the gate electrodes.

In another aspect of the invention, a method comprises forming a first pad film on a substrate. The method further comprises etching trenches in the first pad film, stopping before the substrate, to form raised portions of the first pad film. The method further comprises forming a hard mask in the trenches and over the raised portions. The method further comprises forming a plurality of trenches into the first pad film, the hard mask and the substrate, creating an array of fins comprising: first fins composed of the raised section, the hard mask and the substrate; and second fins composed of the first pad film, the hard mask in the trenches and the substrate. The method further comprises removing the hard mask on the first fins and the second fins, resulting in a dual height array of fins, wherein the first fins are higher than the second fins. The method further comprises forming gate electrodes within each trench of the plurality of trenches, between each fin of the dual height array of fins, which bury the second fins and abut sides of the first fins. The first fins comprising the raised portions electrically and physically isolate adjacent gate electrode of the gate electrodes.

In yet another aspect of the invention, a structure comprises an array of semiconductor fins comprising a plurality of first and second height fin structures. The structure further comprises The structure further comprises a plurality of gate stack regions spanning over the plurality of first height fin structures and abutting the second height fin structure which separate the gate stacks. The structure further comprises a split gate finFET and a fin-isolated double gate finFET wherein the split gate finFET comprises a tall fin structure and the double gate finFET comprises a short fin structure, and a gate electrode structure of height greater than the short fin structure and lesser than the tall fin structure.

In another aspect of the invention, a design structure tangibly embodied in a machine readable storage medium for designing, manufacturing, or testing an integrated circuit is provided. The design structure comprises the structures of the present invention. In further embodiments, a hardware description language (HDL) design structure encoded on a machine-readable data storage medium comprises elements that when processed in a computer-aided design system generates a machine-executable representation of the gate to gate isolation structure, which comprises the structures of the present invention. In still further embodiments, a method in a computer-aided design system is provided for generating a functional design model of the gate to gate isolation structure. The method comprises generating a functional representation of the structural elements of the gate to gate isolation structure.

BRIEF DESCRIPTION OF THE SEVERAL VIEWS OF THE DRAWINGS

The present invention is described in the detailed description which follows, in reference to the noted plurality of drawings by way of non-limiting examples of exemplary embodiments of the present invention.

DETAILED DESCRIPTION

The invention relates to semiconductor structures and methods of manufacture and, more particularly, to devices having gate-to-gate isolation structures and methods of manufacture. More specifically, the present invention includes selectively raised isolation regions at desired gate isolation points to provide isolation structures between adjacent gates (transistors), and methods of manufacture. Advantageously, the structures and methods of the present invention allow for increased device density on the chip, while maintaining minimal image spacing (uniformity) for the technology node. The present invention also advantageously allows the manufacture of gates that are uniform, with uniform pitch, and with repeating patterns. The present invention also allows for flexible circuit design, and can be used for finFETs as well as other devices. Thus, in embodiments, the present invention isolate gates form adjacent FETs without disruption of the regular gate patterns and without large density penalties.

Figure 1:
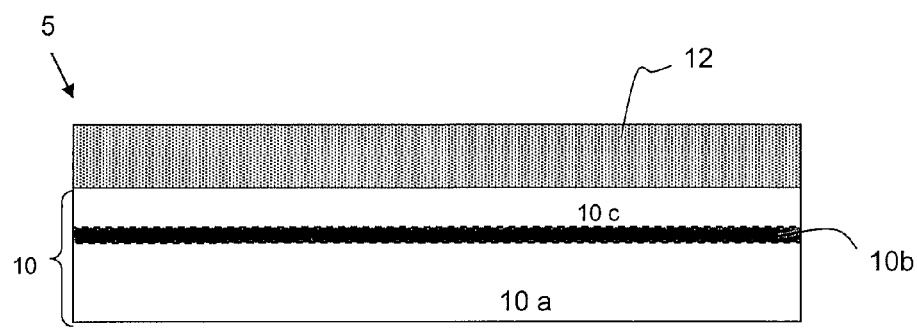
FIGS. 1-7 show structures and respective processing steps in accordance with an aspect of the present invention.

FIGS. 1-7 show structures and respective processing steps in accordance with an aspect of the present invention. More specifically, FIG. 1 is a starting structure 5 comprising a semiconductor wafer (substrate) 10. The wafer 10 can be a BULK Si wafer or a silicon on insulator (SOI) wafer. The SOI wafer can include a buried oxide 10b sandwiched between a lower Si layer 10a and upper silicon layer 10c. Although FIGS. 1-7 show an SOI wafer, it should be understood by those of skill in the art that the structure of the present invention can be equally manufactured with BULK technology.

A pad film 12 is formed on the wafer 10 using, for example, conventional deposition processes such as, for example, chemical vapor deposition (CVD), plasma enhanced CVD (PECVD) or other conventional deposition processes. In embodiments, the pad film 12 can be a stack such as, for example, $SiO_2$ and $Si_3N_4$ or other known pad film materials. In embodiments, the pad film 12 can be about 50 nm to 600 nm in thickness, depending on the design criteria of the device. In embodiments using a stack, the $SiO_2$ can be about 10 nm to about 50 nm and the $Si_3N_4$ can be about 50 nm to about 500 nm.

Figure 2:
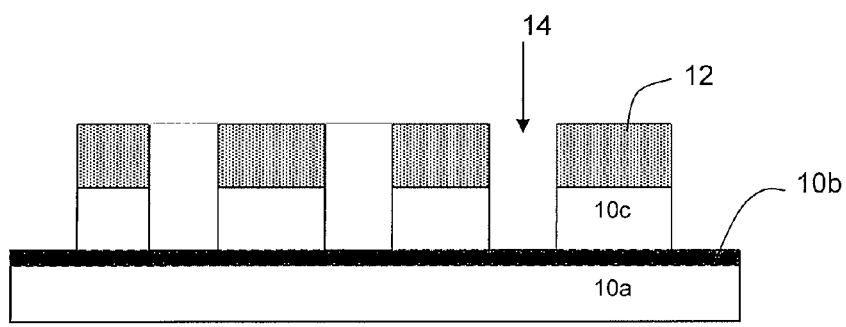

In FIG. 2, trenches 14 are formed in the pad film 12 and portions of the wafer 10. In embodiments using an SOI wafer, the trenches 14 would extend to the oxide layer 10b. The width of the trenches 14 can be about 20 nm and the spacing between the trenches 14 can be about 20 nm or more. In embodiments, the trenches 14 and spacing therebetween are uniform and provide a regular pattern; although other configurations are also contemplated by the present invention. It should be understood by those of skill in the art that as technology nodes advance, the width of the trenches and the spacing therebetween can correspond to the available minimum image spacing.

In embodiments, the trenches 14 can be formed using conventional lithographic processes. For example, a resist can be formed on the pad film 12 and exposed to light to form openings. A reactive ion etching (RIB) is then performed to form the trenches 14. The resist can then be stripped using conventional dry etching techniques, for example.

Figure 3:
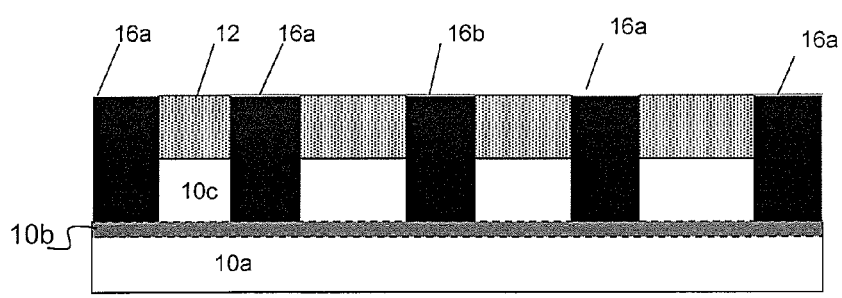

As shown in FIG. 3, the trenches are filled with an insulator material to form isolation structures 16a and 16b. In embodiments, the insulator material is $SiO_2$; although, other insulator materials are also contemplated by the present invention such as, for example, oxide. In embodiments, the insulator material is deposited within the trenches using conventional deposition processes. After the deposition of the insulator material, the structure of FIG. 3 can undergo planarization processes such as, for example, chemical mechanical polishing (CMP).

Figure 4:
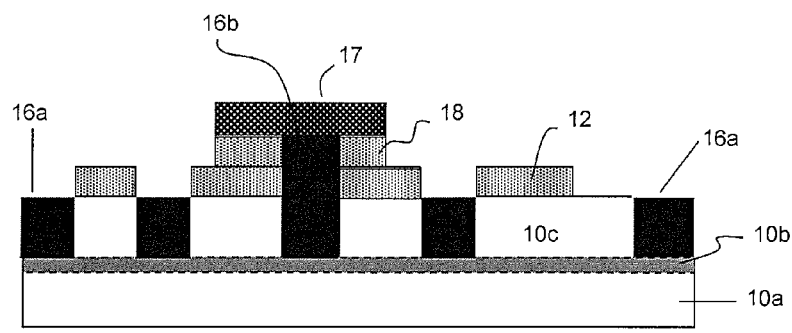

FIG. 4 shows additional processing steps in accordance with aspects of the present invention. More specifically, in embodiments, a mask 17 is formed over the isolation structure 16b, in order to protect the isolation structure 16b from subsequent etching processes. This will ensure that the isolation structure 16b remains at a sufficient height to isolate adjacent gate structures. Advantageously, the isolation structure 16b is at a minimum image spacing, which increases the overall density of the chip, i.e., allows adjacent gates to be isolated, yet separated by a minimal distance.

Once the mask 17 is formed, the unprotected regions, e.g., unprotected portions of the pad film 12 and isolation structures 16a, undergo etching processes, which form a stepped region 18 (higher region) adjacent to the isolation structure 16b (and remaining portion of the structure). In this manner, the isolation structures 16a and 16b are at a dual height.

In embodiments, the etching process can remove portions of the pad film 12 and isolation structures 16a, with later etching processes removing the remaining portions of the pad film 12. In further embodiments, the etching process can remove all of the unprotected portions of the pad film 12 (see, e.g., FIG. 5) and portions of the isolation structures 16a, with later processes removing the remaining portions of the pad film 12 adjacent to the isolation structure 16b. In still further embodiments, a first etching process would only remove portions of the isolation structures 16a, depending on the etch chemistry, with subsequent etching processing removing the pad film 12. In any of these different processing scenarios, the resultant isolation structures 16a and 16b are provided at a dual height, since isolation structures 16a are partially etched to a lower height than the isolation structures 16b.

Figure 5:
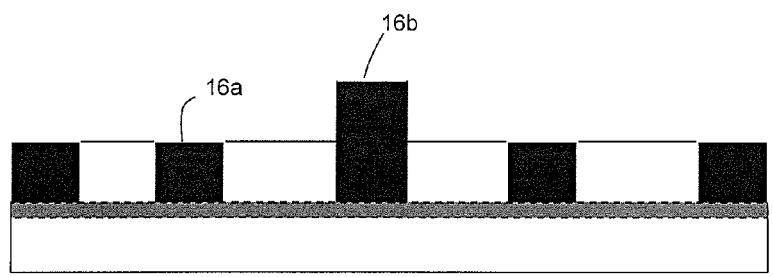

In FIG. 5, the mask 17 and pad film 12 are completely removed, leaving dual height isolation structures 16a and 16b and exposed portions of the wafer 10. In embodiments, the pad film 12 is selectively removed, without removing any material from the isolation structures 16a and 16b. This selective removal process can be accomplished using a selective etch chemistry known to those of skill in the art, which depends on the material used for the isolation structures 16a and 16b and pad film 12. As a result of the etching processes, the isolation structure 16b will be higher (taller) than the surrounding isolation structures 16a. In this way, the structure can comprise a regular array of active semiconductor islands separated by isolation regions, wherein the isolation structures (e.g., isolation regions) comprise a first height isolation region 16a and a second height isolation region 16b.

Figure 6:
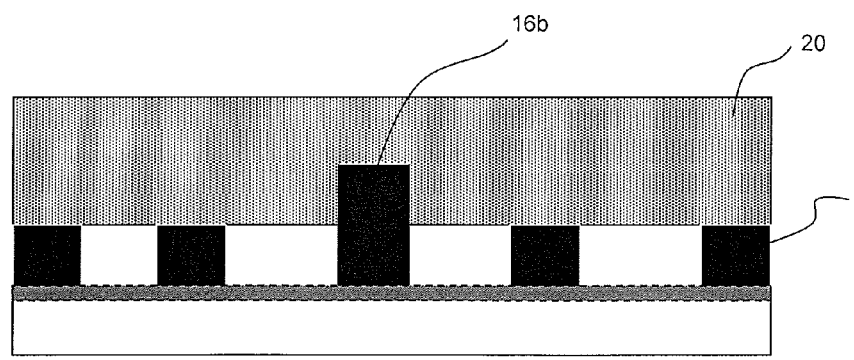

In FIG. 6, a gate stack 20 is formed over the isolation structures 16a and 16b and the exposed portions of the wafer 10. The gate stack 20 can be, for example, a gate dielectric and a gate electrode material, conformally deposited on the isolation structures 16a and 16b and the exposed portions of the wafer 10. In embodiments, the gate dielectric can be, for example, $SiO_2$, with the gate electrode material being polysilicon. In further embodiments, the gate dielectric can be, for example, a high-k dielectric material such as silicon oxy nitride, with the gate electrode material being either a metal or a metal and polysilicon stack. Those of skill in the art should understand that other gate dielectric materials are also contemplated by the present invention, depending on the required performance of the device. Sidewall spacers and capping layers can also be formed using conventional deposition processes.

Figure 7:
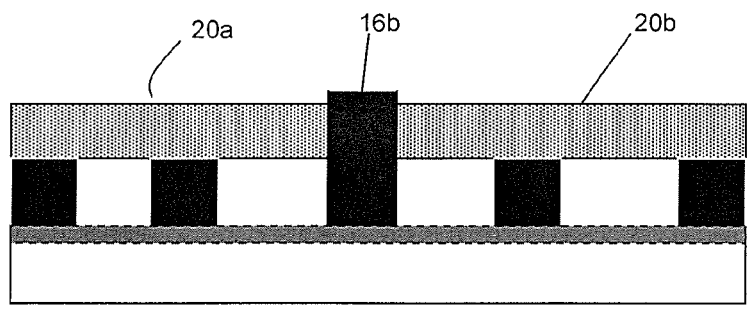

In FIG. 7, the gate electrode 20 is partially etched away to expose the isolation structure 16b. In embodiments, the gate electrode will cover or bury the isolation structures 20a. In this way, gates 20a, 20b, are formed on the wafer 20, separated by the isolation structure 16b. In embodiments, the gates 20a, 20b will abut against the sides of the isolation structure 16b, which will provide a physical and electrical separation between the gates 20a, 20b. It should be understood by those of skill in the art that more than two gates can be formed on the wafer 20 using the processes described herein. Source and drain regions can be formed on the sides of the gates 20a, 20b (in active regions) using conventional doping/implantation processes.

Figure 8:
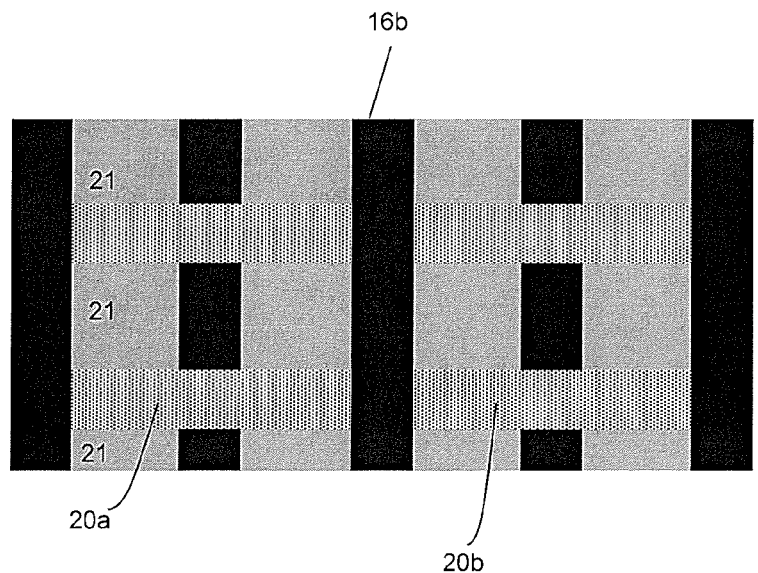
FIG. 8 is a top view of the structure shown in FIG. 7, in accordance with an aspect of the present invention.

FIG. 8 is a top view of the structure of FIG. 7. As shown in FIG. 8, the isolation structure 16b provides a physical and electrical separation between the gates 20a, 20b. In further embodiments, the gates 20a, 20b can extend onto the isolation structures 16a to form contacts. Also, to complete the device fabrication process, source/drain regions 21 can be formed on respective sides of the gate and between each of the isolation structures (in active regions) using conventional doping and/or implantation processes. In further embodiments, contacts can be connected to the source/drain and gate electrodes using conventional etching and metal deposition processes, with upper wire layers also contemplated by the present invention.

Figure 9:
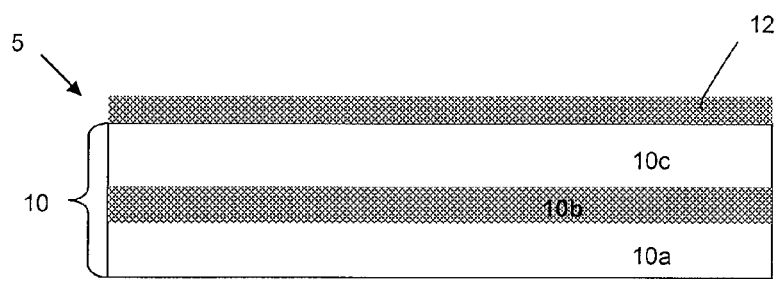
FIGS. 9-14 show structures and respective processing steps in accordance with an aspect of the present invention.

FIGS. 9-14 show structures and respective processing steps in accordance with an aspect of the present invention. More specifically, FIG. 9 is a starting structure 5 comprising a semiconductor wafer (substrate) 10. The wafer 10 can be a BULK Si wafer or a silicon on insulator (SOI) wafer. The SOI wafer can include a buried oxide 10b sandwiched between a lower Si layer 10a and upper silicon layer 10c. Although FIGS. 9-14 show an SOI wafer, it should be understood by those of skill in the art that the structure of the present invention can be equally manufactured with BULK technology.

A pad film 12 is formed on the wafer 10 using, for example, conventional deposition processes such as, for example, chemical vapor deposition (CVD), plasma enhanced CVD (PECVD) or other conventional deposition processes. In embodiments, the pad film 12 can be a stack such as, for example, $SiO_2$ and $Si_3N_4$ or other known pad film materials, as describe above in detail.

Figure 10:
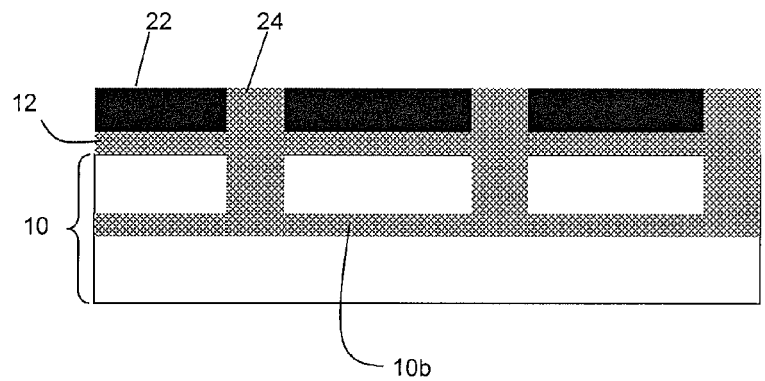

In FIG. 10, a pad film 22 is formed on the pad film 12 using conventional processes such as, for example, CVD, PECVD, etc. In embodiments, the pad film 22 is $Si_3N_4$ so that subsequent etching processes can be performed, as described herein. Trenches are formed in the pad films 12, 22 and portions of the wafer 10 using conventional lithographic processes, as already described. In embodiments using an SOI wafer, the trenches would extend to the oxide layer 10b. The width of the trenches can be about 20 nm and the spacing between the trenches can be about 20 nm or more. It should be understood by those of skill in the art that as technology nodes advance, the width of the trenches and the spacing therebetween can correspond to the available minimum image spacing. In embodiments, the trenches and spacing therebetween are uniform and provide a regular pattern; although other configurations are also contemplated by the present invention.

As further shown in FIG. 10, the trenches are filled with an insulator material to form isolation structures 24. In embodiments, the insulator material is $SiO_2$; although, other insulator materials are also contemplated by the present invention such as, for example, oxide. In embodiments, the insulator material is deposited within the trenches using conventional deposition processes. After the deposition of the insulator material, the structure of FIG. 3 can undergo planarization processes such as, for example, mechanical chemical polishing (CMP).

Figure 11:
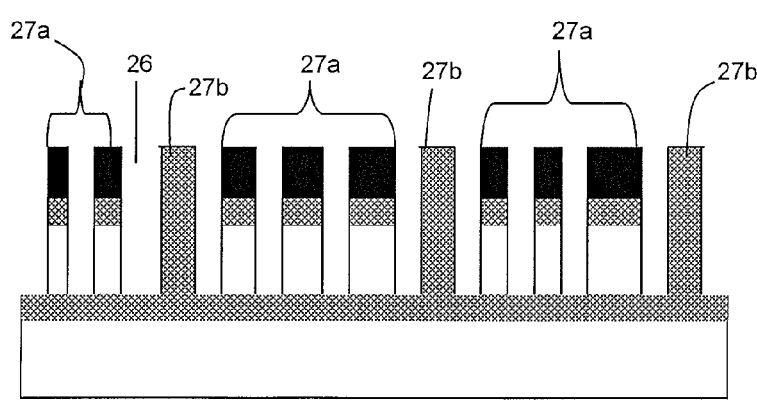

FIG. 11 shows additional trench formation processing in accordance with aspects of the present invention. More specifically, in embodiments, a mask is formed over the structure of FIG. 10 and exposed to light to form a pattern (openings). In embodiments, the openings are formed in uniform and regular patterns, with the mask protecting the isolation structures 24 (or portions thereof) from subsequent etching processes. A RIE process is then performed to form trenches 26 and fins 27a and 27b (also isolation structures). In embodiments, the width of the trenches 26 is about 50 nm, and the spacing between the trenches 26 (e.g., fins 27a, 27b) is about 10 nm. The resist can be stripped in a conventional stripping process. In embodiments, the trenches 27a are formed from a composite of materials including the pad films 12, 22 and a portion of the wafer 10. The trenches 27b, on the other hand, are composed of the insulator material of the isolation structures.

Figure 12:
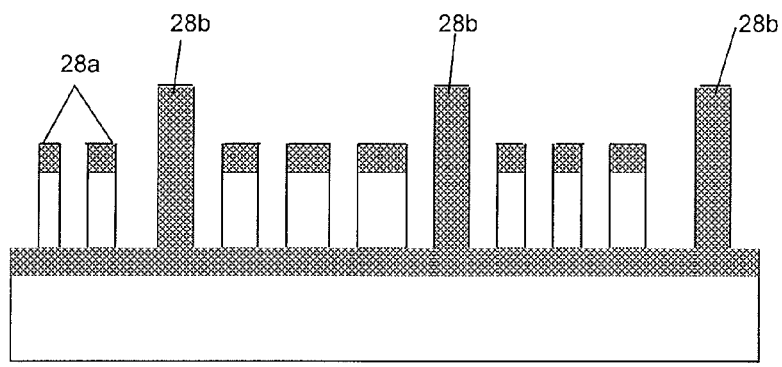

In FIG. 12, the remaining portion of the pad film 22 is removed from the fins 27a, leaving isolation structures 28a and 28b. This results in dual height isolation structures 28a and 28b. As shown, the isolation structure 28b is taller than the surrounding isolation structures 28a. In embodiments, the etching processes is selective to the pad film, e.g., $Si_3N_4$. In this way, the structure comprises a regular array of active semiconductor islands separated by isolation regions, wherein the isolation structures (e.g., isolation regions) comprise a first height isolation region 28a and a second height isolation region 28b.

Figure 13:
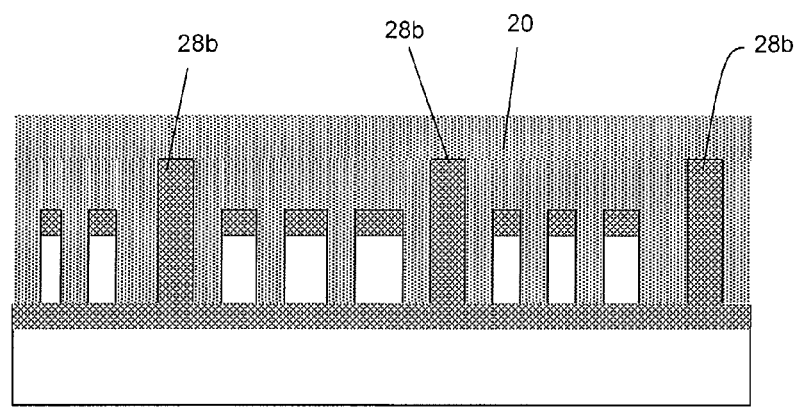

In FIG. 13, gate stack 20 is formed over the isolation structures 28a and 28b and the exposed portions of the wafer 10. The gate stack 20 can be, for example, a gate dielectric and a gate electrode material, conformally deposited on the isolation structures 28a and 28b and the exposed portions of the wafer 10. In embodiments, the gate dielectric can be, for example, $SiO_2$, with the gate electrode material being polysilicon. In further embodiments, the gate dielectric can be, for example, a high-k dielectric material such as silicon oxy nitride, with the gate electrode material being either a metal or a metal and polysilicon stack. Those of skill in the art should understand that other gate dielectric materials are also contemplated by the present invention, depending on the required performance of the device.

Figure 14:
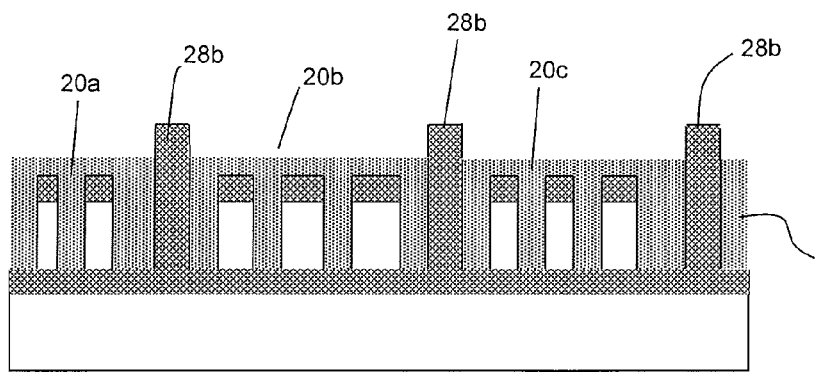

In FIG. 14, the gate electrode 20 is partially etched away to expose the isolation structure 28b. In embodiments, the gate electrode will cover or bury the isolation structures 28a. In this way, gates 20a-20d are formed on the wafer 20, separated by the isolation structures 28b. In embodiments, the gates abut against the sides of the isolation structure 28b, which will provide a physical and electrical separation between the gates 20a-20d. Advantageously, the isolation structures 28b are at a minimum image spacing, which increases the overall density of the chip, i.e., allows adjacent gates to be isolated, yet separated by a minimal distance. It should be understood by those of skill in the art that any number of gates can be formed on the wafer 20 using the processes described herein. Source and drain regions can then be formed on the sides of the gates 20a-20d (in active regions) using conventional doping/implantation processes.

Figure 15:
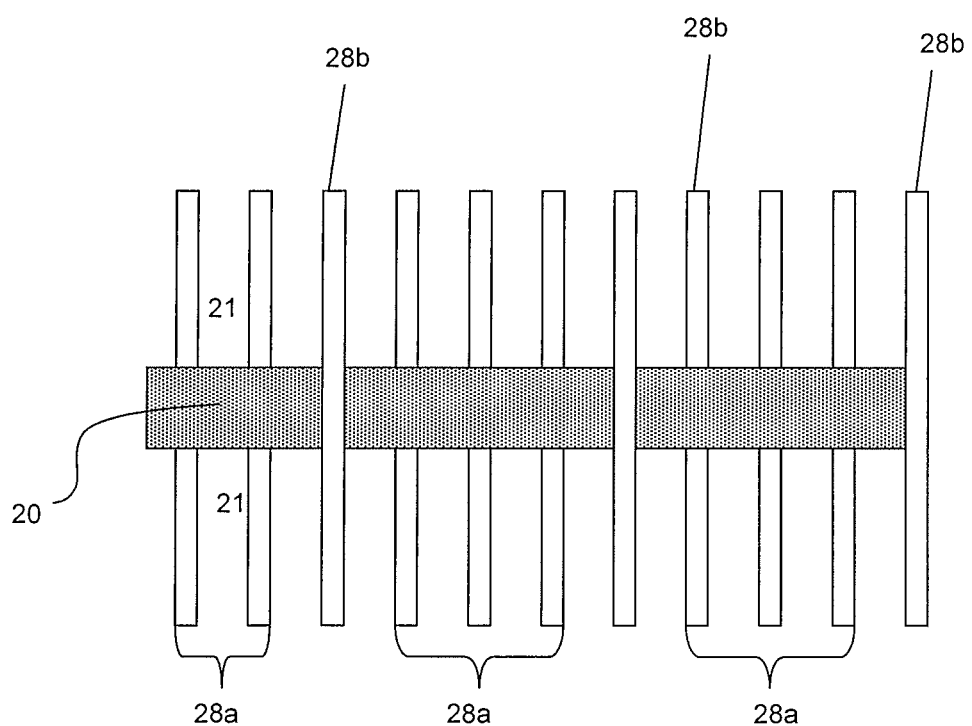
FIG. 15 is a partial top view of the structure shown in FIG. 14, in accordance with an aspect of the present invention.

FIG. 15 is a partial top view of the structure of FIG. 14. As shown in FIG. 15, the isolation structures 28b provide a physical and electrical separation between the gates. In further embodiments, the gates can extend onto the isolation structures 28a to form contacts. Also, to complete the device fabrication process, source/drain regions 21 can be formed on respective sides of the gate and between each of the isolation structures (in active regions) using conventional doping and/or implantation processes. In further embodiments, contacts can be connected to the source/drain and gate electrodes using conventional etching and metal deposition processes, with upper wire layers also contemplated by the present invention.

Figure 16:
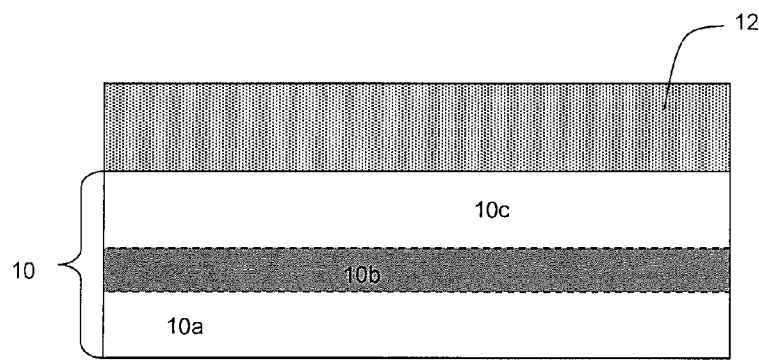
FIGS. 16-23 show structures and respective processing steps in accordance with an aspect of the present invention.

FIGS. 16-23 show structures and respective processing steps in accordance with an aspect of the present invention. More specifically, FIG. 16 is a starting structure 5 comprising a semiconductor wafer (substrate) 10. The wafer 10 can be a BULK Si wafer or a silicon on insulator (SOI) wafer. The SOI wafer can include a buried oxide 10b sandwiched between a lower Si layer 10a and upper silicon layer 10c. Although FIGS. 16-23 show an SOI wafer, it should be understood by those of skill in the art that the structure of the present invention can be equally manufactured with BULK technology.

A pad film 12 is formed on the wafer 10 using, for example, conventional deposition processes such as, for example, chemical vapor deposition (CVD), plasma enhanced CVD (PECVD) or other conventional deposition processes. In embodiments, the pad film 12 can be a stack such as, for example, $SiO_2$ and $Si_3N_4$ or other known pad film materials, as describe above in detail.

Figure 17:
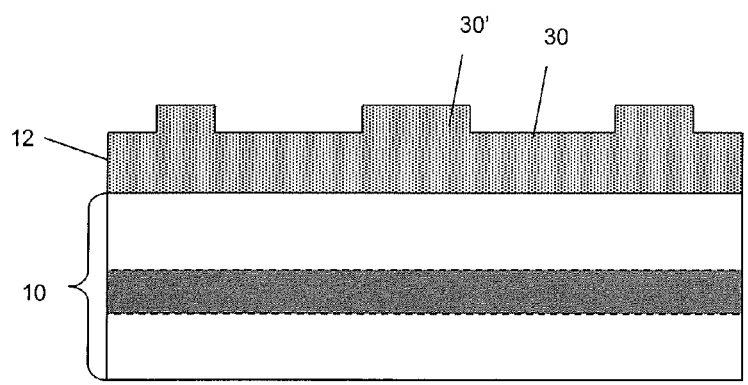
Figure 18:
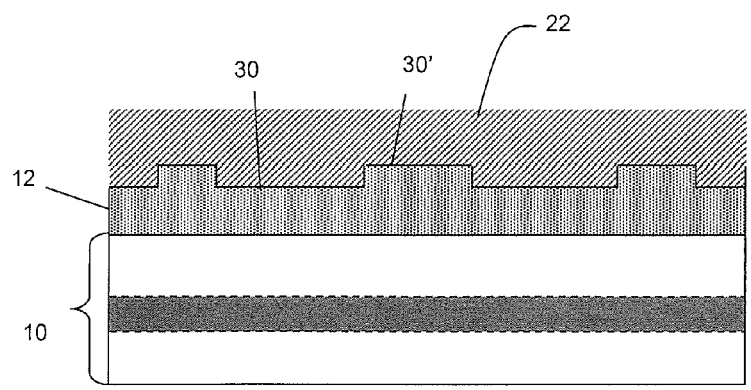

In FIG. 17, shallow trenches 30 are formed in the pad layer 12 using conventional etching processes. The shallow trenches form raised portions 30'. In embodiments, the trenches 30 do not extend into the wafer 10. In FIG. 18, a pad film (e.g., hard mask) 22 is formed in the trenches 30 and on the raised portions 30' of the pad film 12 using conventional processes such as, for example, CVD, PECVD, etc. In embodiments, the pad film 22 is $Si_3N_4$. In embodiments, the pad film 22 extends outside of the trenches.

Figure 19:
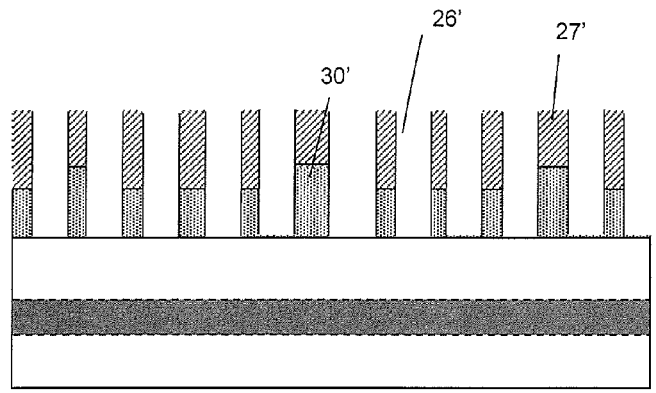

In FIG. 19, trenches 26' are formed in the pad films 12, 22. More specifically, in embodiments, a mask is formed over the structure of FIG. 18 and exposed to light to form a pattern (openings). In embodiments, the openings are formed in uniform and regular patterns. A RIE process is then performed to form trenches 26' and fins 27'. In embodiments, the width of the trenches 26' is about 50 nm, and the spacing between the trenches 27' (e.g., fins 27') is about 10 nm. A plurality of fins 27' can be composed of the raised portion 30'.

Figure 20:
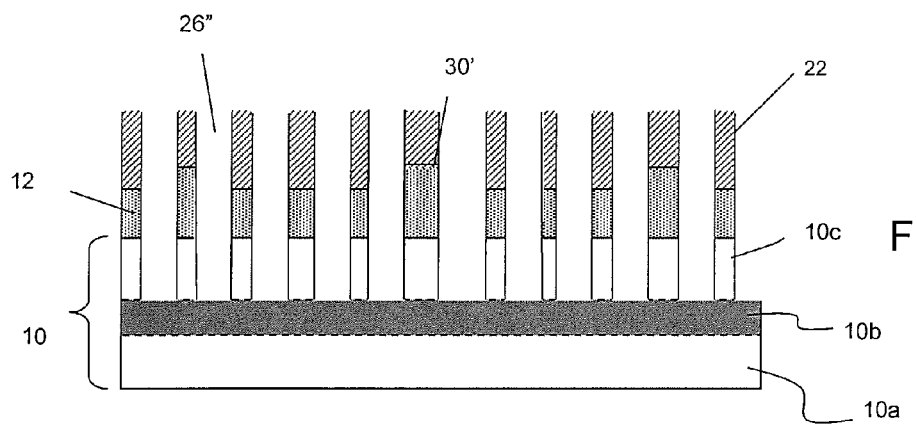

In FIG. 20, the upper film of the wafer 10, e.g., layer 10c, is etched to further increase the depth of the trenches 26'' (e.g., forming a deep trench) to the oxide layer 10b. In BULK technology, the depth of the trenches 26'' can vary within the wafer 10. After the trenches 26'' are fully formed, the resist can be stripped in a conventional stripping process.

Figure 21:
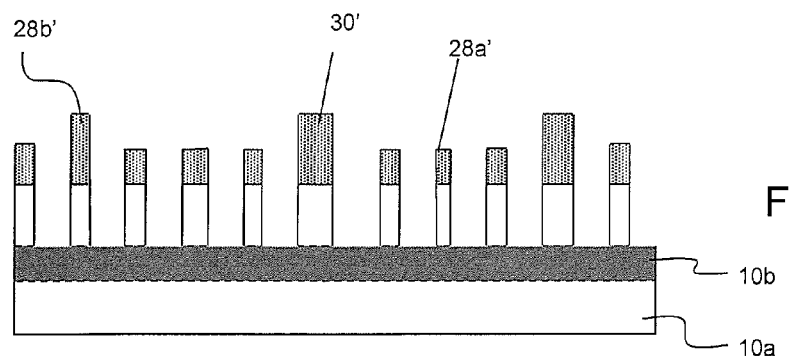

In FIG. 21, the remaining portion of the pad film 22 is removed from the fins, leaving isolation structures 28a' and 28b'. This results in dual height isolation structures 28a' and 28b'. As shown, the isolation structure 28b' is taller than the surrounding isolation structures 28a', as it is composed of the raised portion 30'.

Figure 22:
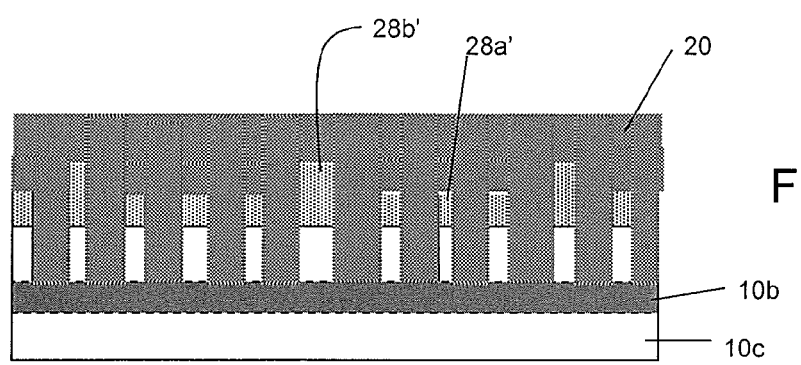

In FIG. 22, gate stack 20 is formed over the isolation structures 28a' and 28b' and the exposed portions of the wafer 10. The gate stack 20 can be, for example, a gate dielectric and a gate electrode material, conformally deposited on the isolation structures 28a' and 28b' and the exposed portions of the wafer 10. In embodiments, the gate dielectric can be, for example, $SiO_2$, with the gate electrode material being polysilicon. In further embodiments, the gate dielectric can be, for example, a high-k dielectric material such as silicon oxy nitride, with the gate electrode material being either a metal or a metal and polysilicon stack. Those of skill in the art should understand that other gate dielectric materials are also contemplated by the present invention, depending on the required performance of the device.

Figure 23:
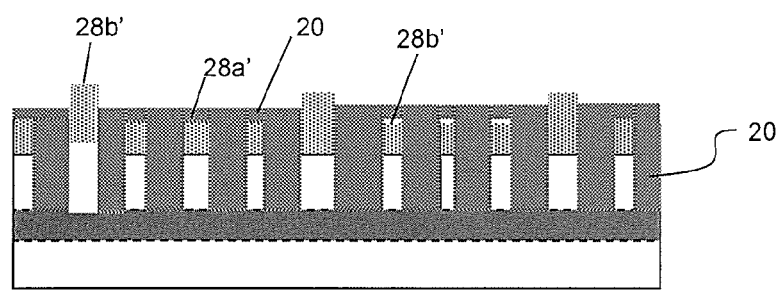

In FIG. 23, the gate electrode 20 is partially etched away to expose the isolation structure 28b'. In embodiments, the gate electrode will cover or bury the isolation structures 28b'. In this way, gates 20a-20b are formed on the wafer 20, separated by the isolation structures 28b'. In embodiments, the gates abut against the sides of the isolation structure 28b', which will provide a physical and electrical separation between the gates 20a-20b. In this way, the structure comprises a regular array of active semiconductor islands separated by isolation regions, wherein the isolation structures (e.g., isolation regions) comprise a first height isolation region 28a' and a second height isolation region 28b'. Also, advantageously, the isolation structures 28b' are at a minimum image spacing, which increases the overall density of the chip, i.e., allows adjacent gates to be isolated, yet separated by a minimal distance. In each aspect of the present invention, the minimum image width (critical image dimension) of the isolation structures is not merely a design criteria, but is only possible with the processes of the present invention.

Source and drain regions can then be formed on the sides of the gates 20a-20b (in active regions) using conventional doping/implantation processes. It should be understood by those of skill in the art that any number of gates can be formed on the wafer 20 using the processes described herein.

Figure 24:
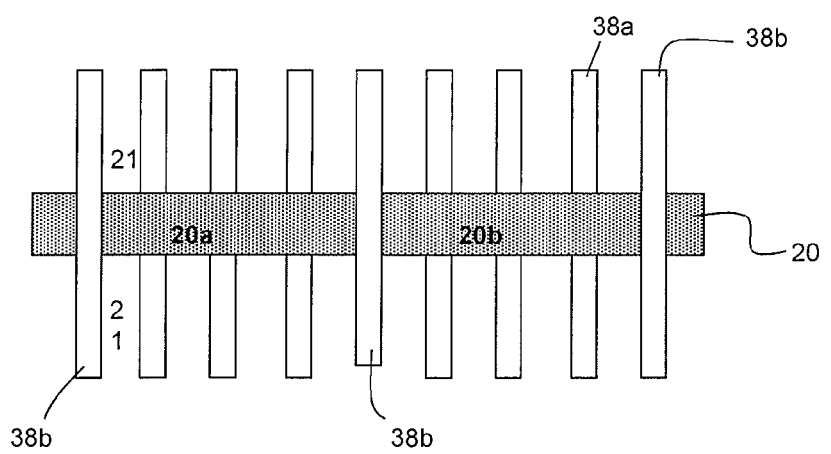
FIG. 24 is a partial top view of the structure shown in FIG. 23, in accordance with an aspect of the present invention.

FIG. 24 is a partial top view of the structure of FIG. 23. As shown in FIG. 24, the isolation structure 28b' provides a physical and electrical separation between the gates. In further embodiments, the gates can extend onto the isolation structures 28a' to form contacts. Also, to complete the device fabrication process, source/drain regions 21 can be formed on respective sides of the gate and between each of the isolation structures (in active regions) using conventional doping and/or implantation processes. In further embodiments, contacts can be connected to the source/drain and gate electrodes using conventional etching and metal deposition processes, with upper wire layers also contemplated by the present invention.

Figure 25:
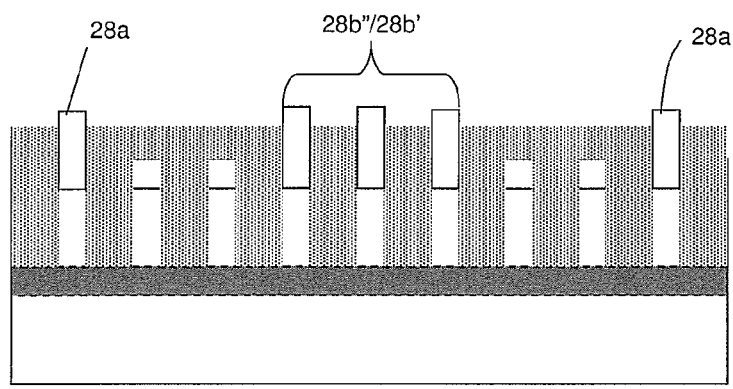
FIG. 25 is a cross sectional of another perspective view of the structure of FIG. 23, in accordance with an aspect of the present invention.
Figure 26:
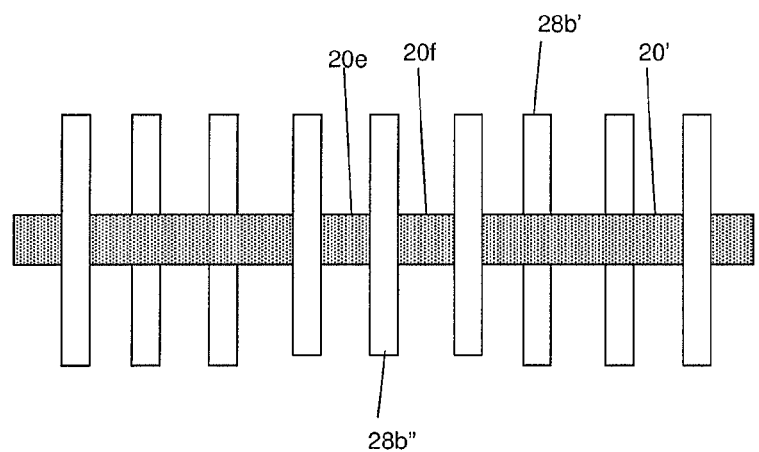
FIG. 26 is a partial top view of the structure shown in FIG. 25, in accordance with an aspect of the present invention.

In FIG. 25 shows a cross sectional view of another perspective of the structure manufactured in accordance with aspects of the present invention. FIG. 26 shows a partial top view of the structure of FIG. 25. As shown in these views, a split gate finFET can be formed using the processes of the present invention. In this structure, the split gate finFET includes two electrically isolated gates 20e, 20f. The electrically isolated gates 20e, 20f are isolated from one another by isolation structure 28b''. The electrically isolated gates 20e, 20f are also isolated from other gates 20' by the isolation structures 28b'. In embodiments, isolation structures 28a; are not formed underneath the gates 20e, 20f, which can each have a separate voltage applied thereto. In this manner, the present invention provides a split gate finFET and fin isolated double gate finFET where the split gate finFET comprises a tall fin structure and the double gate finFET comprises a short fin structure, and a gate electrode structure of a height greater than the short fin structure and less than the tall fin structure. It should be understood by those of skill in the art that any number of gates can be formed on the wafer 20 using the processes described herein.

Figure 27:
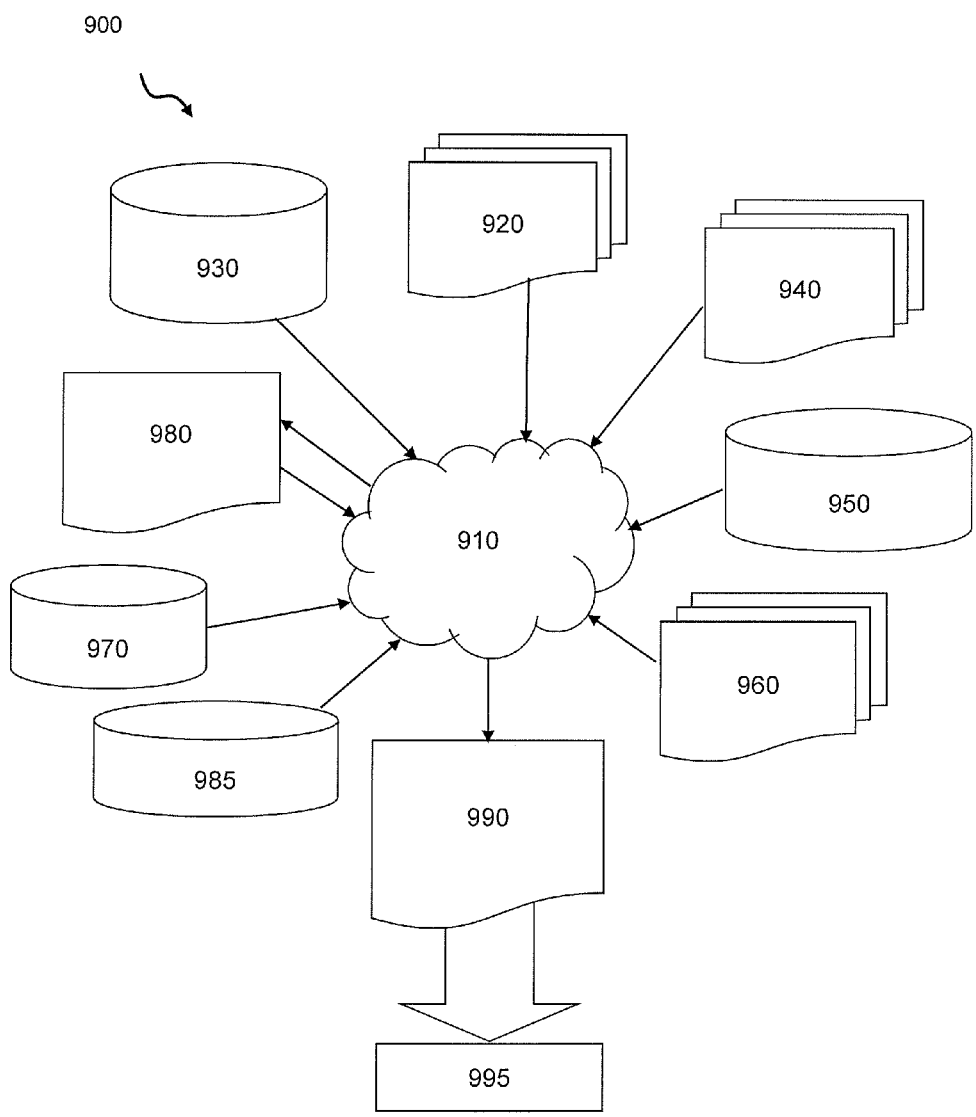
FIG. 27 is a flow diagram of a design process used in semiconductor design, manufacture, and/or test.

FIG. 27 is a flow diagram of a design process used in semiconductor design, manufacture, and/or test. FIG. 27 shows a block diagram of an exemplary design flow 900 used for example, in semiconductor IC logic design, simulation, test, layout, and manufacture. Design flow 900 includes processes, machines and/or mechanisms for processing design structures or devices to generate logically or otherwise functionally equivalent representations of the design structures and/or devices described above and shown in FIGS. 1-26. The design structures processed and/or generated by design flow 900 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems. Machines include, but are not limited to, any machine used in an IC design process, such as designing, manufacturing, or simulating a circuit, component, device, or system. For example, machines may include: lithography machines, machines and/or equipment for generating masks (e.g. e-beam writers), computers or equipment for simulating design structures, any apparatus used in the manufacturing or test process, or any machines for programming functionally equivalent representations of the design structures into any medium (e.g. a machine for programming a programmable gate array).

Design flow 900 may vary depending on the type of representation being designed. For example, a design flow 900 for building an application specific IC (ASIC) may differ from a design flow 900 for designing a standard component or from a design flow 900 for instantiating the design into a programmable array, for example a programmable gate array (PGA) or a field programmable gate array (FPGA) offered by Altera® Inc. or Xilinx® Inc.

FIG. 27 illustrates multiple such design structures including an input design structure 920 that is preferably processed by a design process 910. Design structure 920 may be a logical simulation design structure generated and processed by design process 910 to produce a logically equivalent functional representation of a hardware device. Design structure 920 may also or alternatively comprise data and/or program instructions that when processed by design process 910, generate a functional representation of the physical structure of a hardware device. Whether representing functional and/or structural design features, design structure 920 may be generated using electronic computer-aided design (ECAD) such as implemented by a core developer/designer. When encoded on a machine-readable data transmission, gate array, or storage medium, design structure 920 may be accessed and processed by one or more hardware and/or software modules within design process 910 to simulate or otherwise functionally represent an electronic component, circuit, electronic or logic module, apparatus, device, or system such as those shown in FIGS. 1-26. As such, design structure 920 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 910 preferably employs and incorporates hardware and/or software modules for synthesizing, translating, or otherwise processing a design/simulation functional equivalent of the components, circuits, devices, or logic structures shown in FIGS. 1-26 to generate a netlist 980 which may contain design structures such as design structure 920. Netlist 980 may comprise, for example, compiled or otherwise processed data structures representing a list of wires, discrete components, logic gates, control circuits, I/O devices, models, etc. that describes the connections to other elements and circuits in an integrated circuit design. Netlist 980 may be synthesized using an iterative process in which netlist 980 is resynthesized one or more times depending on design specifications and parameters for the device. As with other design structure types described herein, netlist 980 may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 910 may include hardware and software modules for processing a variety of input data structure types including netlist 980. Such data structure types may reside, for example, within library elements 930 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 940, characterization data 950, verification data 960, design rules 970, and test data files 985 which may include input test patterns, output test results, and other testing information. Design process 910 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 910 without deviating from the scope and spirit of the invention. Design process 910 may also include modules for performing standard circuit design processes such as timing analysis, verification, design rule checking, place and route operations, etc.

Design process 910 employs and incorporates logic and physical design tools such as HDL compilers and simulation model build tools to process design structure 920 together with some or all of the depicted supporting data structures along with any additional mechanical design or data (if applicable), to generate a second design structure 990.

Design structure 990 resides on a storage medium or programmable gate array in a data format used for the exchange of data of mechanical devices and structures (e.g. information stored in a IGES, DXF, Parasolid XT, JT, DRG, or any other suitable format for storing or rendering such mechanical design structures). Similar to design structure 920, design structure 990 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIGS. 1-26. In one embodiment, design structure 990 may comprise a compiled, executable HDL simulation model that functionally simulates the devices shown in FIGS. 1-26.

Design structure 990 may also employ a data format used for the exchange of layout data of integrated circuits and/or symbolic data format (e.g. information stored in a GDSII (GDS2), GL1, OASIS, map files, or any other suitable format for storing such design data structures). Design structure 990 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIGS. 1-26. Design structure 990 may then proceed to a stage 995 where, for example, design structure 990: proceeds to tape-out, is released to manufacturing, is released to a mask house, is sent to another design house, is sent back to the customer, etc.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims, if applicable, are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principals of the invention and the practical application, and to enable others of ordinary skill in the art to understand the invention for various embodiments with various modifications as are suited to the particular use contemplated. Accordingly, while the invention has been described in terms of embodiments, those of skill in the art will recognize that the invention can be practiced with modifications and in the spirit and scope of the appended claims.

What is claimed:

1. A structure comprising:
   an array of semiconductor fins comprising a plurality of first and second height fin structures;
   a plurality of gate stack regions spanning over the plurality of first height fin structures and abutting the second height fin structure which separate the gate stacks; and
   further comprising:
   a split gate finFET and a fin-isolated double gate finFET wherein the split gate finFET comprises a tall fin structure and the double gate finFET comprises a short fin structure, and
   a gate electrode structure of height greater than the short fin structure and lesser than the tall fin structure;
   wherein the plurality of first height fin structures comprise a silicon layer and a pad film of a first height, and the plurality of second height fin structures comprise the silicon layer and the pad film of a second height.

2. The structure of claim 1, wherein the array of semiconductor fins are separated by trenches.

3. The structure of claim 1, wherein the split gate finFET includes electrically isolated gates.

4. The structure of claim 3, wherein the electrically isolated gates are two electrically isolated gates.

5. The structure of claim 3, wherein electrically isolated gates are isolated from one another by isolation structure.

6. The structure of claim 5, wherein the electrically isolated gates are isolated from other gates by the isolation structures.

7. The structure of claim 6, wherein the isolation structures are not formed underneath the gates, which can each have a separate voltage applied thereto.

8. A structure comprising:
   a plurality of isolation fin structures of a first height;
   a plurality of isolation fins structures of a second height, different than the first height;
   a plurality of gate structures formed over the plurality of isolation fin structures of the first height and separated by the plurality of isolation fins structures of the second height, wherein the plurality of isolation fin structures of the first height comprise an upper silicon layer and a pad film of a first height, and the plurality of isolation fin structures of the second height comprise the upper silicon layer and the pad film of a second height.

9. The structure of claim 8, wherein the plurality of gate structures are formed within trenches between each of the plurality of isolation fin structures of first and second height.

10. The structure of claim 8, wherein the first height is smaller than the second height.

11. The structure of claim 8, wherein the pad film of the plurality of isolation fin structures of the second height comprise insulator material.

12. The structure of claim 11, wherein the insulator material is $SiO_2$.

13. The structure of claim 11, wherein the upper silicon layer is formed from a BULK wafer.

14. The structure of claim 11, wherein the upper silicon layer is formed from a Silicon on Insulator (SOI).

15. The structure of claim 8, wherein the upper silicon layer is formed from a BULK wafer.

16. The structure of claim 8, wherein the upper silicon layer is formed from a Silicon on Insulator (SOI).

17. The structure of claim 8, wherein the plurality of isolation fin structures of the second height extend above the gate structures.

18. The structure of claim 8, wherein the plurality of isolation fin structures of the second height electrically and physically isolate adjacent gate electrodes of the gate structures.

19. The structure of claim 8, wherein the plurality of isolation fin structures of the second height are at a height to isolate adjacent gate electrodes.

20. The structure of claim 1, wherein the pad film of the second height is higher than the pad film of the first height.

* * * * *